(12) United States Patent
Ferreira et al.

(10) Patent No.: US 11,521,125 B2
(45) Date of Patent: Dec. 6, 2022

(54) COMPRESSION AND DECOMPRESSION OF TELEMETRY DATA FOR PREDICTION MODELS

(71) Applicant: EMC IP Holding Company LLC, Hopkinton, MA (US)

(72) Inventors: Paulo Abelha Ferreira, Rio de Janeiro (BR); Pablo Nascimento da Silva, Niterói (BR); Adriana Bechara Prado, Niterói (BR)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 410 days.

(21) Appl. No.: 16/775,824

(22) Filed: Jan. 29, 2020

(65) Prior Publication Data

US 2021/0232968 A1 Jul. 29, 2021

(51) Int. Cl.
*H03M 7/30* (2006.01)
*G06N 20/00* (2019.01)
*G06N 5/04* (2006.01)

(52) U.S. Cl.
CPC .............. *G06N 20/00* (2019.01); *G06N 5/04* (2013.01); *H03M 7/3059* (2013.01); *H03M 7/70* (2013.01)

(58) Field of Classification Search
CPC .... H03M 7/3059; H03M 7/70; G06N 3/0454; G06N 3/088
See application file for complete search history.

(56) References Cited

U.S. PATENT DOCUMENTS

| 9,185,188 | B1* | 11/2015 | Li | G06F 3/0617 |
|---|---|---|---|---|
| 9,590,655 | B2* | 3/2017 | Kim | H03M 7/6011 |
| 10,838,826 | B2* | 11/2020 | Bajaj | G06F 16/188 |
| 11,126,666 | B2* | 9/2021 | Wolff | G06F 16/906 |
| 11,151,221 | B2* | 10/2021 | Hara | G06N 5/003 |
| 2007/0013927 | A1* | 1/2007 | Miyahara | H04N 1/6058 358/1.9 |
| 2007/0058874 | A1* | 3/2007 | Tabata | H04N 19/60 375/E7.088 |
| 2012/0310871 | A1* | 12/2012 | Cruz-Albrecht | G06N 3/049 706/33 |
| 2015/0066881 | A1* | 3/2015 | Sundaram | H04L 43/062 707/693 |
| 2018/0260721 | A1* | 9/2018 | Hara | G06N 20/20 |
| 2019/0251189 | A1* | 8/2019 | VanderSpek | G06F 16/1756 |
| 2019/0370120 | A1* | 12/2019 | Bajaj | G06F 16/9027 |
| 2020/0119748 | A1* | 4/2020 | Lucarelli | H03M 13/2906 |
| 2020/0382530 | A1* | 12/2020 | Li | G06K 9/6267 |
| 2021/0027194 | A1* | 1/2021 | Monaghan | G06N 5/02 |

(Continued)

*Primary Examiner* — Lam T Mai
(74) *Attorney, Agent, or Firm* — Workman Nydegger

(57) ABSTRACT

An autoregressor that compresses input data for a specific purpose. Input data is compressed using a compression/decompression framework and by accounting for a purpose of a prediction model. The compression aspect of the framework is distributed and the decompression aspect of the framework may be centralized. The compression/decompression framework and a machine learning prediction model can be centrally trained. The compressor is distributed to nodes such that the input data can be compressed and transmitted to a central node. The model and the compression/decompression framework are continually trained on new data. This allows for lossy compression and higher compression rates while maintaining low prediction error rates.

20 Claims, 5 Drawing Sheets

(56) References Cited

U.S. PATENT DOCUMENTS

2021/0027206 A1* 1/2021 Monaghan ............. G06N 20/20
2021/0064634 A1* 3/2021 Guo ..................... G06F 16/906
2021/0089922 A1* 3/2021 Lu ........................... G06N 3/04
2021/0174246 A1* 6/2021 Triplet ................... G06N 3/082

* cited by examiner

COMPRESSION AND DECOMPRESSION OF TELEMETRY DATA FOR PREDICTION MODELS

FIELD OF THE INVENTION

Embodiments of the present invention generally relate to machine learning, machine learning using data such as telemetry data, and to compression/decompression frameworks. More particularly, at least some embodiments of the invention relate to systems, hardware, software, computer-readable media, and methods for machine learning based on distributed data sources and to an automatic compression/decompression framework and to centrally trained compression/decompression models used in prediction models.

BACKGROUND

A prediction model, particularly when associated with distributed data sources, are difficult to both train and keep trained for various reasons. One challenge is to keep the prediction model updated with the most recent data. Updating the prediction model with the most recent data ensures that the collected data are diverse. When the prediction model is not updated with the most recent data, the predictions are likely to decline in accuracy. Because the data may be generated at distributed sources, the ability to use up to date data.

More specifically, prediction models that rely on or use distributed data sources have difficulty in keeping up the amount of data generated by the distributed data sources. In other words, prediction models that rely on distributed data can consume substantial bandwidth at least because of the need to transmit the data to a centralized infrastructure. Consequently, it is imported to have a method for compressing the data that is transmitted to the centralized infrastructure.

By way of example, an off-the-shelf lossless compression algorithm running on a conventional computer can take around 1 minute to compress a database that includes around 1 million 68-dimensional data points. In this example, the off-the-shelf lossless compression algorithm can achieve 70% compression. The ability to go beyond this level of compression requires some form of lossy compression. Lossy compression, however, may impact the prediction error rate and raises the concern of maintaining acceptable prediction errors. There is thus a need to do more than simply achieve higher compression ratios. There is also a need to reduce the compression time such that the impact on customers and running applications is minimized while maintaining acceptable prediction error rates.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings, in which.

DETAILED DESCRIPTION OF SOME EXAMPLE EMBODIMENTS

Figure 1:
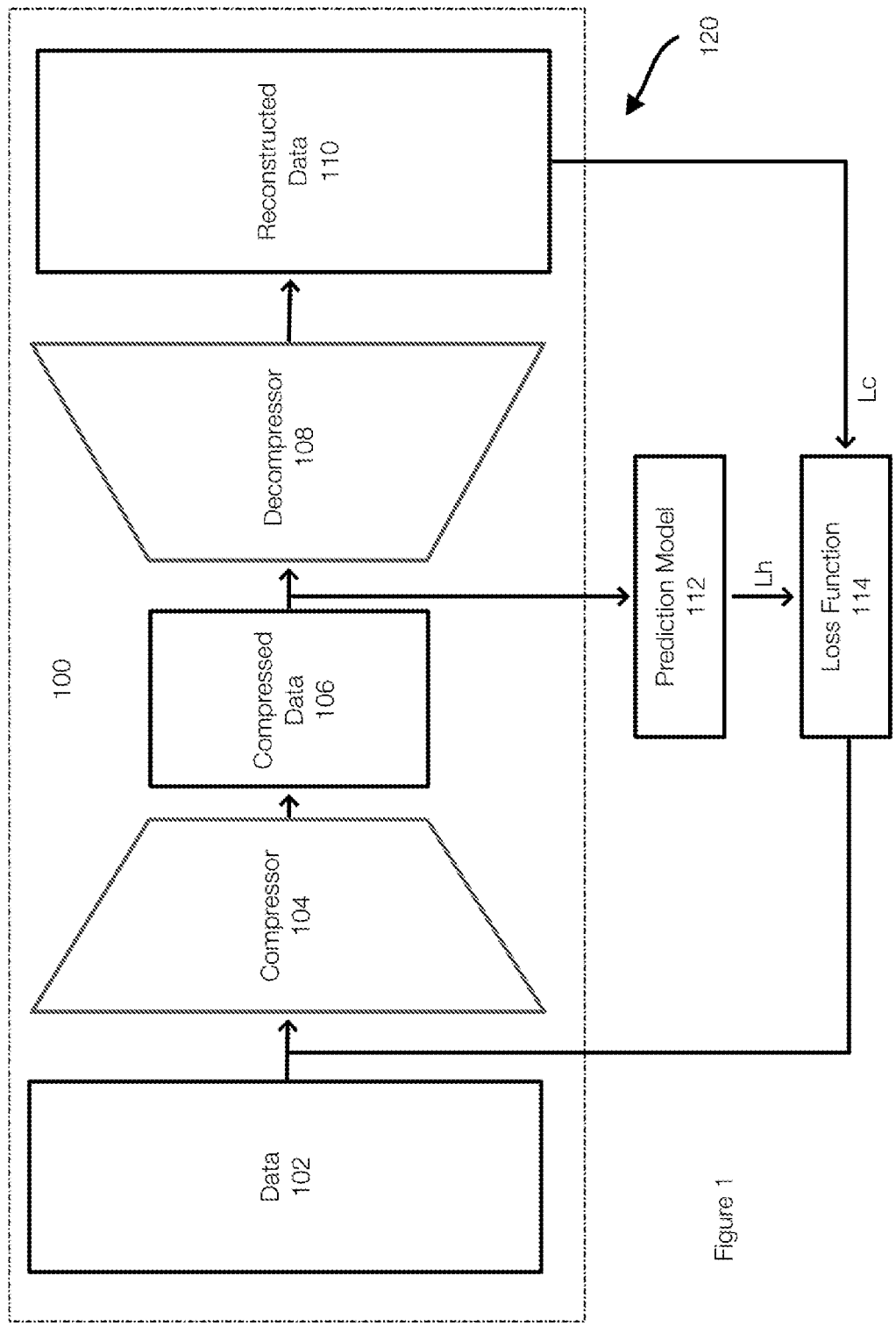
FIG. 1 illustrates an example of an autoregressor that is configured to compress the data and predict.

Embodiments of the present invention generally relate to artificial intelligence, machine learning, prediction models, neural networks, and/or compression/decompression systems and frameworks. More particularly, at least some embodiments of the invention relate to systems, hardware, software, computer-readable media, and/or methods for machine learning in the context or a compression/decompression framework. Embodiments of the invention further relate to an autoregressor that is further configured to generate a specific prediction or perform a specific prediction task in addition to performing compression and/or decompression. Embodiments of the invention advantageously compress data for at least one specific purpose rather than agnostic compression.

Embodiments of the invention relate to a prediction system that relies on distributed or remote data sources and to telemetry data or other data associated with or generated by those data sources. More specifically, telemetry data from various sources, which may be distributed sources, can be used to train a particular prediction model. When it is not possible to learn such a model in a distributed manner, a large amount of data must be sent to a central node (e.g., a datacenter), which becomes responsible for (re-) training the machine learning model, using the most recent collected data.

As previously stated, constantly sending large amounts of data is often prohibitive from a bandwidth or transmission perspective. As a result, compression methods may be used to address this issue. Compression algorithms can reduce the amount of data being sent to the central node, allowing more frequently data transfer to train or re-train the prediction or machine learning model.

Embodiments of the invention relate to a framework that both compresses/decompresses data and accounts for training a particular prediction model. An artificial intelligence (AI) engine may be provided at a central node (e.g., at a datacenter). The AI engine may receive a signal or an indication that prediction errors are high or that sufficient data has been received by or transferred to the central node. Once this signal or indication is received, the AI engine learns a new compression/decompression model or retrains the existing model. The compression/decompression model may include a compressor for compressing data and a decompressor for decompressing the compressed data. The decompressor is typically stored and operated at the central node while the compressor is delivered or distributed to the data nodes. The process of retraining and redistributing the compression/decompression framework or portions thereof can be repeated. This allows the compressors at the data nodes to be updated based on the most current data and/or based on when a prediction rate error becomes unacceptable.

Embodiments of the invention relate to learning an intelligent compression/decompression model for a specific purpose such that high compression rates are achieved and low error rates are maintained. Embodiments of the invention are discussed in the context of a task for predicting read and write response times based on historical telemetry data. The telemetry data thus reflects actual read and write response times in one example. The ability to accurately predict read and write response times can be used in data protection operations and may be used to manage an adequate recovery point objective (RPO) for example.

In this example, the input into the compression/decompression model is telemetry data. By way of example only and not limitation the telemetry data may include a set of highly dimensional data samples. Compression algorithms can search for patterns and achieve a 70% compression rate. Embodiments of the invention achieve a higher compression ratio by finding additional patterns in the data using machine learning (e.g., using a deep neural network). Machine learning allows complex (e.g., non-linear) patterns in the telemetry data to be identified. This allows the data to be compressed at higher compression rates. Plus, the data can be used for a specific purpose such as predicting read and write response times.

FIG. 1 illustrates an example of a compression/decompression framework that includes an auto-encoder. More specifically, FIG. 1 illustrates an autoregressor 120 that is configured to compress data, decompress data, and/or generate predictions for a specific purpose. The autoregressor 120 may include an autoencoder 100. The operations performed by the autoregressor 120 may be performed at disparate or distributed locations. For example, compression may occur on the data nodes or at the input. Decompression, training, and/or prediction may occur on a centralized node after receiving the compressed data from the data nodes. In one example, an auto-encoder is an example of a deep neural network that is configured to learn to compress and decompress high-dimensional data.

The auto-encoder 100 is configured, by way of example only, to find non-linear patterns in the data 102 that decrease and then increase the dimensionality of the data so as to reconstruct the original data. The auto-encoder 100 learns by itself how to compress the data 102 using only information coming from the data 102 itself.

Generally, the auto-encoder 100 operates as follows and is described without regard to location. The data 102 (e.g., telemetry data) is input into a compressor 104. The compressor 104 may be a neural network that can generate compressed data 106. The compressed data 106 is then provided or transmitted to a decompressor 108, which is configured to decompress the compressed data 106 to retrieve the reconstructed data 110. In one example, the compression is lossless. In some examples, the compression may be lossy such that the reconstructed data 110 is associated with an error rate or signal.

In one example, the compressor 104 may be implemented on the data nodes and the decompressor 108 may be implemented on a central node (e.g., a datacenter). In this example, the compressed data 106 is also provided to a prediction model 112 that is configured to generate a prediction or an inference. Specifically, the prediction model 112 may learn from the data to predict read and write response times (e.g., at the data nodes).

More specifically, the process of compressing/decompressing telemetry data using an auto-encoder 100 as described in FIG. 1 operates by obtaining the input data 102 (e.g., the telemetry data). Next, the input data 102 is passed through a compressor (e.g., an encoder) $f_\theta$ generating Z. Z is an example of the compressed data 106. The decompressor 108 (decoder) $g_\theta$ can be used to decompress the compressed data 106 to generate the decompressed or reconstructed data 110.

FIG. 1 also illustrates machine learning or a prediction model 112. As previously stated, the data 102 is compressed for a specific reason (e.g., prediction of response times based on telemetry data). Thus, the compressor 104 is configured to do more than simply compress the data 102 in one example. The data is compressed for the purposes of a prediction.

FIG. 1 thus illustrates an autoregressor 120 that includes the autoencoder 100. The autoregressor 120 jointly learns how to compress and predict (regress). In this example, the autoregressor 120 is a deep neural network that uses the result of a regression model to build the compressor/decompressor.

In one example, the increasing availability of data coming from different systems (data nodes) and the use of machine learning methods is used to build an intelligent compressor-decompressor framework for a specific prediction task. As previously stated, agnostic compression does not take into account the purpose of the compression itself. The autoregressor 120 illustrated in FIG. 1 allows the compressor/decompressor framework to be provided with certain information. Thus, the autoregressor 120 jointly learns how to compress and decompress the data and predict the desired variable.

The model or the compressor 104 learns through two error signals: an error reconstruction metric of the data ($L_c$) and a prediction error metric ($L_h$). The autoencoder 100 shown in FIG. 1 operates as previously described. In addition, the compressed data 106 follows two paths. The compressed data 106 is used as the input of the compressor decoder ($g_{74}(Z)$) as previously described and is also used for training a prediction model (h(Z)). The quality of these tasks are measured using the following loss function:

$$L(L_c, L_h) = aL_c + bL_h.$$

In one example, $L_c$ measures the quality of the decompressed or reconstructed data 110 (i.e., the amount of error introduced into the data by using a lossy compression), $L_h$ measures the quality of predictions, a is the weight of the compression loss, and b is the weight of the prediction loss, such that a+b=1. The loss function L 114 is used to adjust the weights of the auto-encoder 100. In one example, a and b may be set by default. Initially, for example, a=b=0.5.

Thus, the autoregressor 120, in addition to managing compression/decompression, is also configured to predict a variable or other inference and may incorporate the loss function 114. By incorporating the loss function 114 into the weights of the compressor 104 (when implemented at least as a neural network), the compression is performed with a specific task or purpose in mind.

In addition, embodiments of the invention can control the compression ratio if necessary. In one example, the autoencoder 100 or the autoregressor 120 may include or may be able to accommodate a shrinkage parameter. The shrinkage parameter allows a user to select the adequate compression rate for a given scenario. For example, the size of the latent layer is defined according to the compression rate parameter ($\alpha$), so that $|Z|=\alpha|X|$. In other words, the size of the compressed data 106 is related to the size of the data 102 by a factor $\alpha$. The size of the compressed output data is defined by the user depending on how much compression is needed and how high the prediction accuracy should be.

Figure 2:
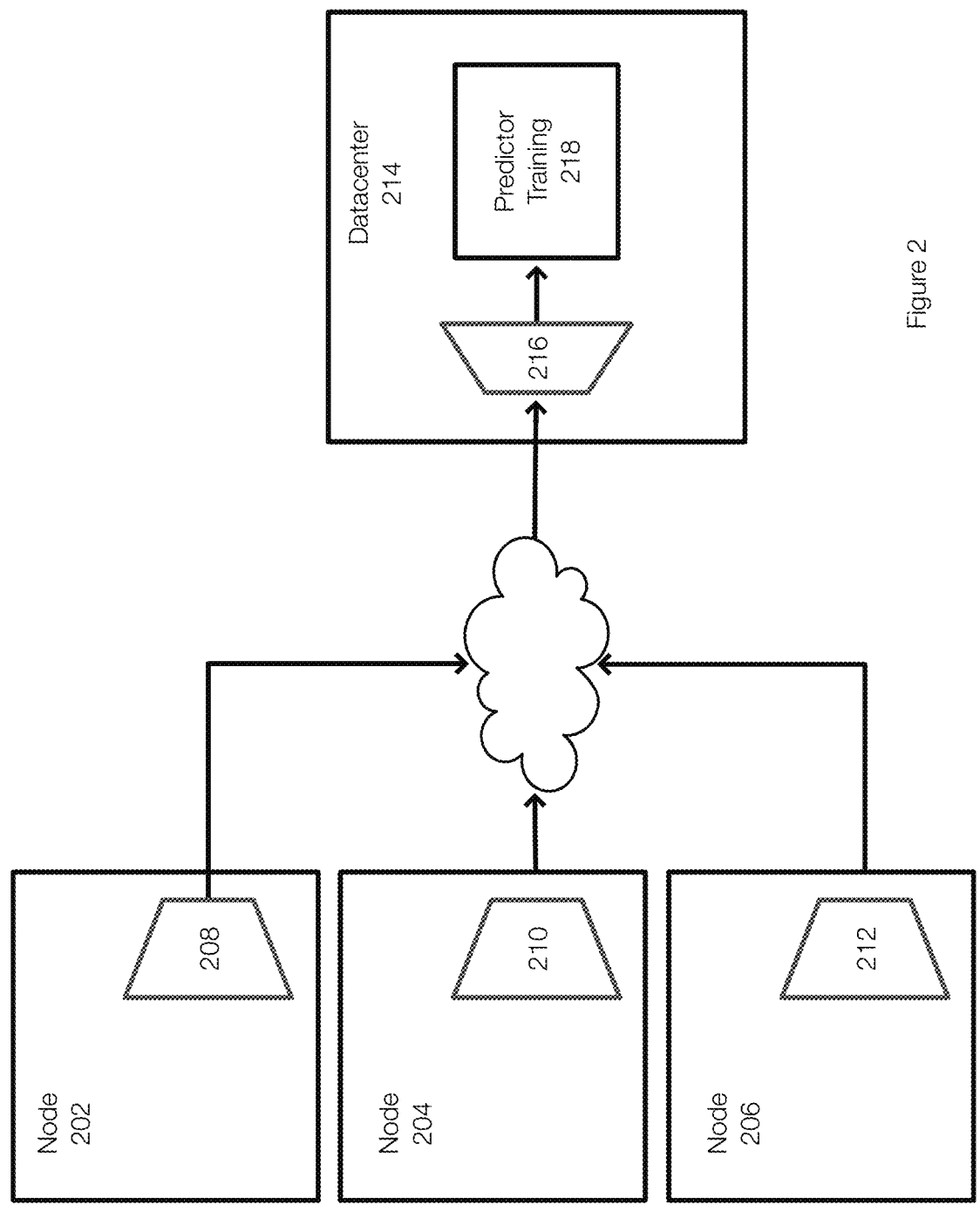
FIG. 2 illustrates an example of a distributed autoregressor that is centrally trained.

FIG. 2 illustrates an example of a distributed autoencoder or autoregressor. FIG. 2 illustrates a datacenter 214, which is an example of a centralized infrastructure that includes processors, memory, and other hardware. The datacenter 214 may be configured to implement at least a portion of a compression/decompression framework and/or perform training based on compressed data received from distributed sources. FIG. 2 also illustrates nodes 202, 204, 206, which are examples of data nodes or sources and which may be distributed. The nodes 202, 204 and 206 may be geographically distributed. Alternatively, the nodes 202, 204, and 206 may be operating as together (e.g., a system of appliances or virtual machines that are performing data protection operations).

In FIG. 2, each of the nodes 202, 204, and 206 is provided with a compressor. Thus, the compressors 208, 210, and 212 are installed or associated with, respectively, the nodes 202, 204 and 206. The compressors 208, 210, and 212 are similarly configured and reduce the amount of data transferred to the datacenter 214 by compressing the source data. The data collected by the datacenter 214 through the compressors 208, 210, and 212 may be decompressed by the decompressor 218 and used for various purposes including predictor training 218, autoencoder training, or the like. In other words, the data from the data nodes is used to train one or more models or to retrain the machine learning predictor models.

More specifically, once the compressed data is sent from the nodes 202, 204 and 206 (via the compressors 208, 210, and 212), the datacenter 214 may decompress the data using the decompressor 216. As previously stated, these components (compressor/decompressor) may be constructed for a prediction task. Thus, the decompressed data may be used for predictor training 218. In other words, the data is used for training a machine learning predictor in one example. Error signals may be provided back to the nodes 316, 318, and 320 in order to adapt their compressors based on current prediction error rates or the like.

Figure 3:
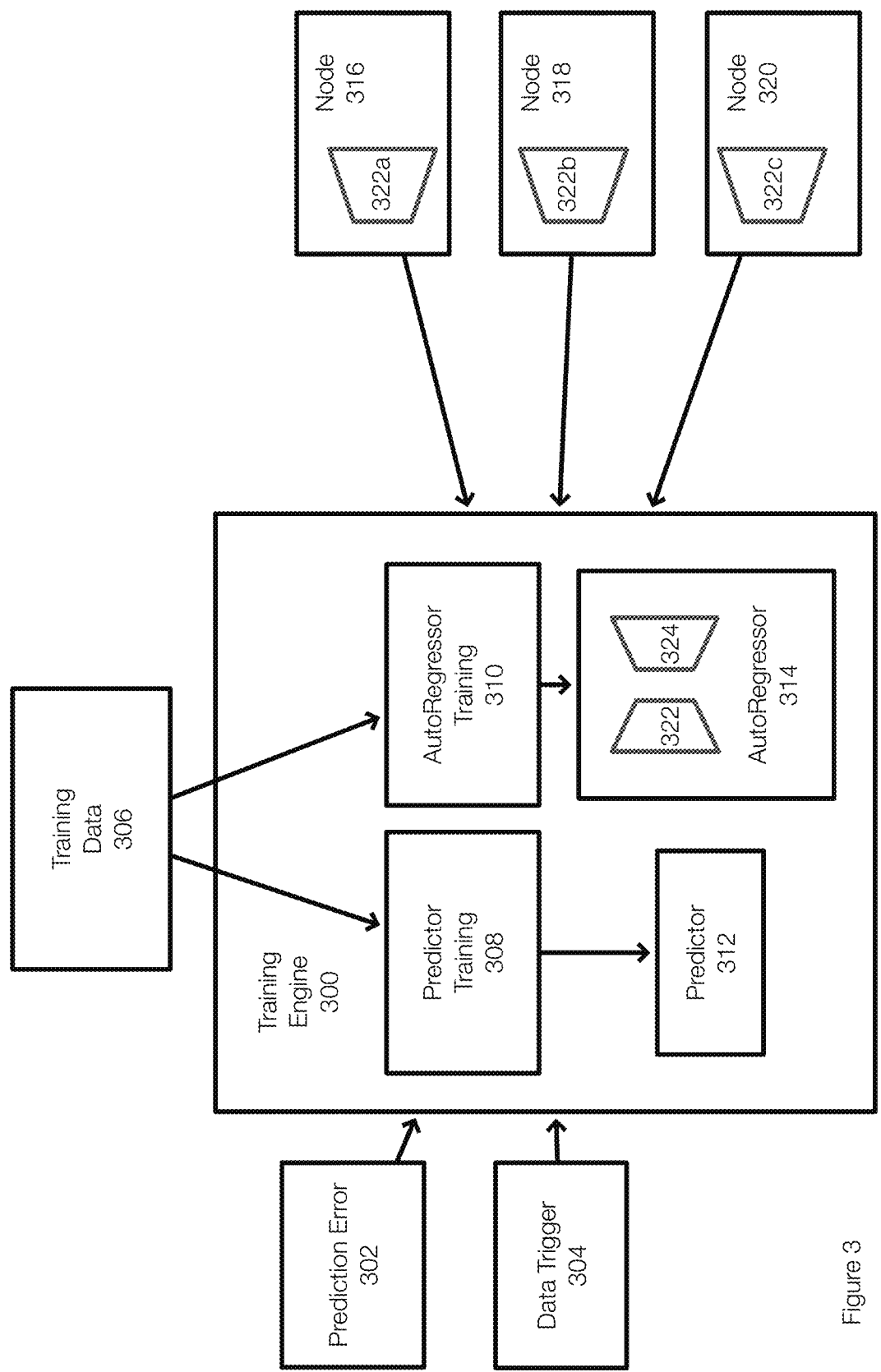
FIG. 3 illustrates an example of a system configured to perform autoencoder training and prediction training.

FIG. 3 illustrates an example of an auto training framework for compression, decompression, and/or prediction. FIG. 3 illustrates a training engine 300 (an example of AI) that may be implemented on a datacenter or other node. The training engine 300 includes predictor training 308 that uses training data 306 to train a predictor 312. The training data 306 may be the data received from the nodes 316, 318 and 320. The predictor training 308 can occur automatically to keep the predictor 312 or other model updated with the most recent data. This is accomplished by constantly transmitting compressed data from the nodes 316, 318, and 320 to the training engine 300 at the central node.

More specifically, the auto training framework also assures low prediction error rates by updating the prediction model or the predictor 312. In this example, the training engine 300 is configured to receive a prediction error 302 and/or a data trigger 304. The prediction error 302 indicates that the error rate of the predictor 312 is too high. The data trigger 304 indicates that sufficient data has been received for retraining.

Thus, when a certain amount of data are gathered at the central node and/or when the prediction quality degrades, a signal is triggered that is captured by an AI engine or by the training engine 300. The training engine 300 can perform autoregressor training 310, which trains the autoregressor 314 including the compressor 322 and/or the decompressor 324. The training of the compressor-decompressor model and the prediction model uses the data stored by or accessible by the training engine 300 or by a central node responsible for training. Further, the compression parameter ratio (e.g., shrinkage parameter) can also be updated dynamically, on command, or the like.

Once the models (e.g., the predictor 312 and/or the autoregressor 314) are trained or retrained, the decompressor 324 and the predictor 312 replace the deprecated models at the central node. The compressor 322 is provided or broadcast to the nodes 316, 318, 320 as, respectively, compressors 322a, 322b, and 322c.

This invention leverages the availability of real telemetry data coming from different data nodes to build an intelligent compression/decompression model that is able to achieve very high rates of compression while maintaining acceptable levels of prediction errors. Additionally, it allows the selection of a compression rate threshold, where one can select the amount of data to be transferred and its relation with prediction quality.

More specifically, embodiments of the invention provide an auto-training framework for compression, decompression, and prediction. The compression/decompression model can be applied by an auto-training framework that keeps it up to date with the latest telemetry data coming from the data nodes. The updated compressor is automatically broadcasted back to each data node. Concomitantly, the updated decompressor is kept at the centralized infrastructure to be used when the new compressed data comes in. Thus, the auto-training framework maintains a synced and updated compressor-decompressor model.

For example, there are situations where it is advantageous to predict a given variable based on a large number of other variables. One example of this is the prediction of response times from telemetry data. In this case, a response time predictor is kept up to date with the most recent telemetry data. As previously stated, this requires large chunks of data to be sent from all the systems (data nodes) to a centralized infrastructure. The auto-training framework discussed herein, which may include a compressor-decompressor, is jointly trained with a predictor, achieves high rates of compression, while keeping low response time prediction errors.

The compressor-decompressor framework discussed herein was implemented in the context of a research project. The input data came from the Sizer reporter database, a tool that allows field engineers to upload performance files from a customer site, in order to generate performance reports. The data are composed of 1 million 68-dimensional observations. Here, the efficiency of training a response time predictor with data previously compressed and decompressed by using the disclosed framework.

The quality metric used to compare different Machine Learning prediction models and assess prediction error was the mean absolute percentage error (MAPE). MAPE represents, how far, proportionally, the predicted values are from the actual values, on average.

The implemented intelligent compressor-decompressor model (autoregressor) was able to maintain the MAPE below 12% for compressions rate up to 93%, while agnostic lossless compression achieved 70% compression rate with an error of 9%. Thus, a similar MAPE was achieved, but with much higher compression rates. Furthermore, the time it took to compress the data using the compression/decompression model was about 6× faster than using a traditional lossless compression method, running on the same conventional computer. Embodiments of the invention needed about 10 seconds to compress the data, while the agnostic lossless compression method took around 1 minute to compress the same data collection.

Figure 4:
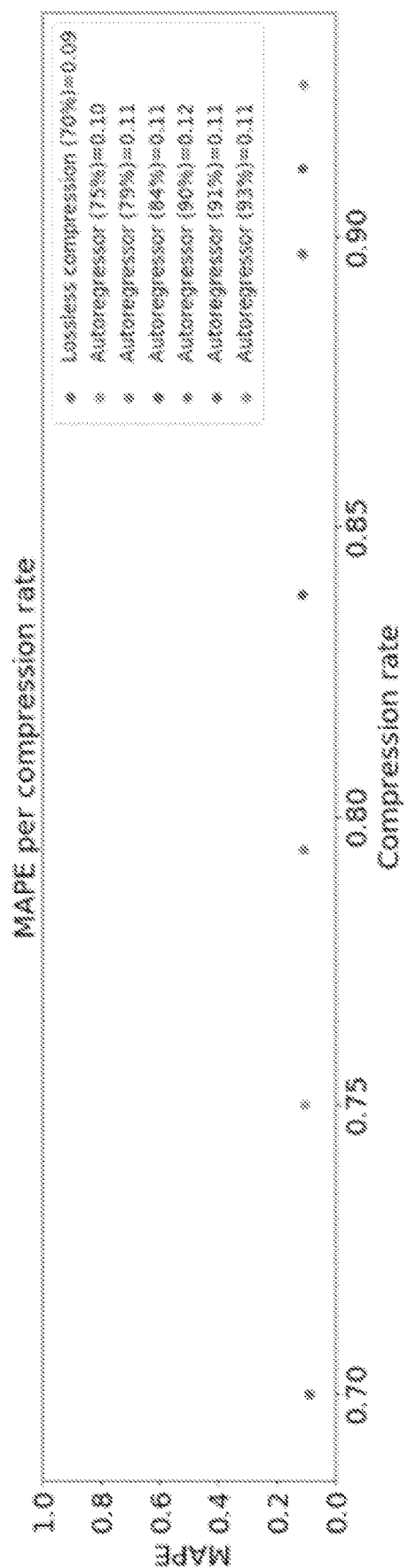
FIG. 4 illustrates a table illustrating relationships between error rates and compression ratios.

FIG. 4 depicts a table illustrating a trade-off between prediction error and compression rate.

Figure 5:
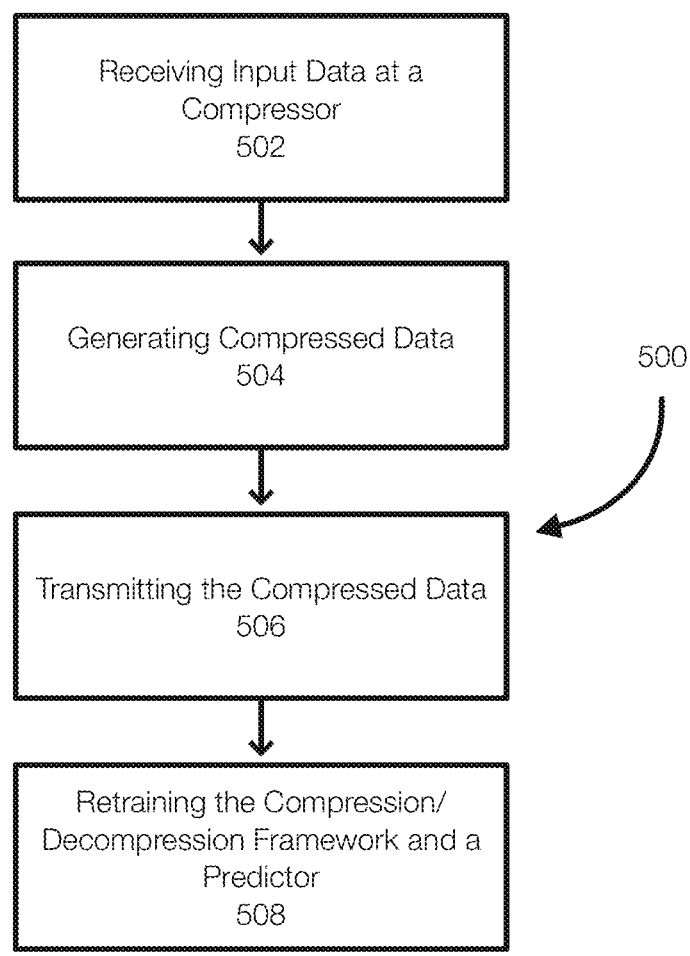
FIG. 5 illustrates an example of a method for maintaining or updating prediction models.

FIG. 5 illustrates an example of a method for updating prediction models or for a compression/decompression framework. The method of FIG. 5 may incorporate one or more of the elements or aspects discussed with respect to the other Figures disclosed herein. The method 500 may begin by receiving 502 input data at a compressor. In a distributed system, this may occur at multiple nodes. Each node may be a data source and each node may provide input data to a compressor. In one example, the compressors are similarly if not identically configured.

Each of the compressors generates 504 compressed data. In addition to compressing the input data, the input data is compressed such that the data can be used for machine learning training. This is distinct from a compressor whose goal is maximum compression. Embodiments of the compression/decompression framework compress the data in a manner that accounts for a specific purpose. This is achieved by using error signals. A compression error signal and a prediction error signal result in a loss function that can change weights of the compressor. This allows the compressor to compress and account for model training and/or prediction error rates.

In one example, the compression may be lossy while still maintaining adequate prediction error rates and compression loss rates. This achieves higher compression rates. Next, the compressed data is transmitted 506 to a central node. A decompressor at the central node may decompress the compressed data received from multiple nodes or compressors.

The compressed data (or the decompressed data) may be used to perform further training or retraining 508 of the compression/decompression framework and of the prediction model. This allows a compressor, decompressor, predictor, or the like to be trained using up-to-date data. The compressor can be distributed such that the compression at the nodes is performed based on the latest retrained model using the most up-to-date data.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

The following is a discussion of aspects of example operating environments for various embodiments of the invention. This discussion is not intended to limit the scope of the invention, or the applicability of the embodiments, in any way.

In general, embodiments of the invention may be implemented in connection with systems, software, and components, that individually and/or collectively implement, and/or cause the implementation of, compression operations, decompression operations, loss function operations, neural network operations and adjustment operations, training (e.g., machine learning training) operations, model update operations, or the like. More generally, the scope of the invention embraces any operating environment in which the disclosed concepts may be useful.

At least some embodiments of the invention provide for the implementation of the disclosed functionality in existing backup platforms, examples of which include the Dell-EMC NetWorker and Avamar platforms and associated backup software, and storage environments such as the Dell-EMC DataDomain storage environment. In general however, the scope of the invention is not limited to any particular data backup platform or data storage environment.

New and/or modified data collected and/or generated in connection with some embodiments, may be stored in a data protection environment that may take the form of a public or private cloud storage environment, an on-premises storage environment, and hybrid storage environments that include public and private elements. Any of these example storage environments, may be partly, or completely, virtualized. The storage environment may comprise, or consist of, a datacenter which is operable to service read, write, delete, backup, restore, and/or cloning, operations initiated by one or more clients or other elements of the operating environment. Where a backup comprises groups of data with different respective characteristics, that data may be allocated, and stored, to different respective targets in the storage environment, where the targets each correspond to a data group having one or more particular characteristics.

Example public cloud storage environments in connection with which embodiments of the invention may be employed include, but are not limited to, Microsoft Azure, Amazon AWS, and Google Cloud. More generally however, the scope of the invention is not limited to employment of any particular type or implementation of cloud storage.

In addition to the storage environment, the operating environment may also include one or more clients that are capable of collecting, modifying, and creating, data. As such, a particular client may employ, or otherwise be associated with, one or more instances of each of one or more applications that perform such operations with respect to data.

Devices in the operating environment may take the form of software, physical machines, or virtual machines (VM), or any combination of these, though no particular device implementation or configuration is required for any embodiment. Similarly, data protection system components such as databases, storage servers, storage volumes (LUNs), storage disks, replication services, backup servers, restore servers, backup clients, and restore clients, for example, may likewise take the form of software, physical machines or virtual machines (VM), though no particular component implementation is required for any embodiment. Where VMs are employed, a hypervisor or other virtual machine monitor (VMM) may be employed to create and control the VMs. The term VM embraces, but is not limited to, any virtualization, emulation, or other representation, of one or more computing system elements, such as computing system hardware. A VM may be based on one or more computer architectures, and provides the functionality of a physical computer. A VM implementation may comprise, or at least involve the use of, hardware and/or software. An image of a VM may take various forms, such as a .VMDK file for example.

As used herein, the term 'data' is intended to be broad in scope. Thus, that term embraces, by way of example and not limitation, data segments such as may be produced by data stream segmentation processes, data chunks, data blocks, atomic data, emails, objects of any type, files of any type including media files, word processing files, spreadsheet files, and database files, as well as contacts, directories, sub-directories, volumes, and any group of one or more of the foregoing.

Example embodiments of the invention are applicable to any system capable of storing and handling various types of objects, in analog, digital, or other form. Although terms such as document, file, segment, block, or object may be used by way of example, the principles of the disclosure are not limited to any particular form of representing and storing data or other information. Rather, such principles are equally applicable to any object capable of representing information.

As used herein, the term 'backup' is intended to be broad in scope. As such, example backups in connection with which embodiments of the invention may be employed include, but are not limited to, full backups, partial backups, clones, snapshots, and incremental or differential backups.

Following are some further example embodiments of the invention. These are presented only by way of example and are not intended to limit the scope of the invention in any way.

Embodiment 1. A method, comprising receiving input data at a compressor from a plurality of data sources, wherein the compressor is configured to compress the data for a purpose associated with a predictor, generating compressed data by the compressor, transmitting the compressed data to a central node, wherein the compressed data is received by both a decompressor and the predictor, and retraining the compressor and the predictor based on the compressed data.

Embodiment 2. The method of embodiment 1, further comprising decompressing the compressed data with a decompressor.

Embodiment 3. The method of embodiment 1 and/or 2, further comprising retraining the decompressor.

Embodiment 4. The method of embodiment 1, 2 and/or 3, further comprising generating an error signal based on an error rate associated with the predictor and based on a loss associated with compressing the input data, wherein the compression is lossy.

Embodiment 5. The method of embodiment 1, 2, 3 and/or 4, further comprising adjusting a compression ratio of the compressor.

Embodiment 6. The method of embodiment 1, 2, 3, 4 and/or 5, further comprising distributing an updated compressor to each of the plurality of data sources.

Embodiment 7. The method of embodiment 1, 2, 3, 4, 5, and/or 6, further comprising retraining the predictor and/or the compressor when sufficient compressed data is received from the plurality of data sources or when a prediction error rate exceeds a threshold.

Embodiment 8. The method of embodiment 1, 2, 3, 4, 5, 6, and/or 7, wherein the compressor accounts for the purpose when compressing the input data.

Embodiment 9. The method of embodiment 1, 2, 3, 4, 5, 6, 7, and/or 8, further comprising training using the compressed data or decompressed data.

Embodiment 10. The method of embodiment 1, 2, 3, 4, 5, 6, 7, 8, and/or 9, wherein a compression ratio is greater than a pre-established value (e.g., 70%).

Embodiment 11. A non-transitory storage medium having stored therein instructions that are executable by one or more hardware processors to perform the operations of any one or more of embodiments 1 through 11.

Embodiment 12. Any of embodiments 1-12 and/or any other aspects of the disclosure.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Any one or more of the entities disclosed, or implied, by the Figures and/or elsewhere herein, may take the form of, or include, or be implemented on, or hosted by, a physical computing device, and may be incorporated into embodiments disclosed herein. As well, where any of the aforementioned elements comprise or consist of a virtual machine (VM), that VM may constitute a virtualization of any combination of the physical components disclosed herein.

The physical computing device includes a memory which may include one, some, or all, of random access memory (RAM), non-volatile random access memory (NVRAM), read-only memory (ROM), and persistent memory, one or more hardware processors, non-transitory storage media, UI device, and data storage. One or more of the memory components of the physical computing device may take the form of solid state device (SSD) storage. As well, one or more applications may be provided that comprise instructions executable by one or more hardware processors to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud storage site, client, datacenter, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
   receiving input data at a compressor from a plurality of data sources, wherein the compressor is configured to compress the data for a purpose associated with a predictor;
   generating compressed data by the compressor;
   transmitting the compressed data to a central node, wherein the compressed data is received by both a decompressor and the predictor; and
   retraining the compressor and the predictor based on the compressed data.

2. The method of claim 1, further comprising decompressing the compressed data with a decompressor.

3. The method of claim 2, further comprising retraining the decompressor.

4. The method of claim 1, further comprising generating an error signal based on an error rate associated with the predictor and based on a loss associated with compressing the input data, wherein compressing the input data is lossy.

5. The method of claim 1, further comprising adjusting a compression ratio of the compressor.

6. The method of claim 1, further comprising distributing an updated compressor to each of the plurality of data sources.

7. The method of claim 1, further comprising retraining the predictor and/or the compressor when sufficient compressed data is received from the plurality of data sources or when a prediction error rate exceeds a threshold.

8. The method of claim 1, wherein the compressor accounts for the purpose when compressing the input data.

9. The method of claim 1, further comprising training using the compressed data or decompressed data.

10. The method of claim 1, wherein a compression ratio is greater than a pre-established value.

11. A non-transitory computer readable medium having stored therein instructions that are executable by one or more hardware processors to perform operations comprising:
    receiving input data at a compressor from a plurality of data sources, wherein the compressor is configured to compress the data for a purpose associated with a predictor;
    generating compressed data by the compressor;
    transmitting the compressed data to a central node, wherein the compressed data is received by both a decompressor and the predictor; and
    retraining the compressor and the predictor based on the compressed data.

12. The non-transitory computer readable medium of claim 11, the operations further comprising decompressing the compressed data with a decompressor.

13. The non-transitory storage medium of claim 12, the operations further comprising retraining the decompressor.

14. The non-transitory computer readable medium of claim 11, the operations further comprising generating an error signal based on an error rate associated with the predictor and based on a loss associated with compressing the input data, wherein compressing the data is lossy.

15. The non-transitory computer readable medium of claim 11, the operations further comprising adjusting a compression ratio of the compressor.

16. The non-transitory computer readable medium of claim 11, the operations further comprising distributing an updated compressor to each of the plurality of data sources.

17. The non-transitory computer readable medium of claim 11, the operations further comprising retraining the predictor and/or the compressor when sufficient compressed data is received from the plurality of data sources or when a prediction error rate exceeds a threshold.

18. The non-transitory computer readable medium of claim 11, the operations wherein the compressor accounts for the purpose when compressing the input data.

19. The non-transitory computer readable medium of claim 11, the operations further comprising training using the compressed data or decompressed data.

20. The non-transitory computer readable medium of claim 11, wherein a compression ratio is greater than a pre-established value.

* * * * *